United States Patent
Traa

(10) Patent No.: US 7,535,963 B2
(45) Date of Patent: May 19, 2009

(54) DATA PROCESSING CIRCUIT WITH A DRIVER AND A RECEIVER

(75) Inventor: Willebrordus Gerardus Traa, Eindhoven (NL)

(73) Assignee: NXP B.V., Eindhoven (NL)

( * ) Notice: Subject to any disclaimer, the term of this patent is extended or adjusted under 35 U.S.C. 154(b) by 561 days.

(21) Appl. No.: 10/543,433

(22) PCT Filed: Jan. 26, 2004

(86) PCT No.: PCT/IB2004/050052

§ 371 (c)(1),
(2), (4) Date: Jul. 26, 2005

(87) PCT Pub. No.: WO2004/068812

PCT Pub. Date: Aug. 12, 2004

(65) Prior Publication Data

US 2006/0140283 A1 Jun. 29, 2006

(30) Foreign Application Priority Data

Jan. 29, 2003 (EP) .................................. 03100183

(51) Int. Cl.
*H04B 3/00* (2006.01)
(52) U.S. Cl. ...................................... 375/257
(58) Field of Classification Search ................... 375/257
See application file for complete search history.

(56) References Cited

U.S. PATENT DOCUMENTS

| | | | | |
|---|---|---|---|---|
| 5,412,689 A | * | 5/1995 | Chan et al. | 375/288 |
| 6,359,931 B1 | | 3/2002 | Perino et al. | |
| 6,556,628 B1 | * | 4/2003 | Poulton et al. | 375/257 |
| 6,987,822 B2 | * | 1/2006 | Huber | 375/346 |
| 2004/0165669 A1 | * | 8/2004 | Otsuka et al. | 375/257 |
| 2006/0062313 A1 | * | 3/2006 | Huber | 375/257 |

OTHER PUBLICATIONS

Ted L. Simpson, "Effect of a Conducting Shield on the Inductance of an Air-Core Solenoid," IEEE Transactions on Magnetics, vol. 35, No. 1, Jan. 1999.*

* cited by examiner

*Primary Examiner*—David C Payne
*Assistant Examiner*—Nader Bolourchi

(57) ABSTRACT

A data processing circuit has four signal conductors between a driver and a receiver, and first and second, mutually conducting shield planes. First and second signal conductors form a symmetrical stack in a column between the first and the second plane. Third and fourth signal conductors are arranged substantially midway between the first and the second plane, on mutually opposite sides of the stack. The first, second, third and fourth signal conductors have respective widths so that respective transmission line impedances of transmission lines between each particular one of the first, second, third and fourth conductors and the first and second planes are substantially mutually equal.

13 Claims, 2 Drawing Sheets

DATA PROCESSING CIRCUIT WITH A DRIVER AND A RECEIVER

RELATED DOCUMENTS

This patent document is the national stage filing under 35 U.S.C. § 371 of International Application No. PCT/IB2004/050052 filed on Jan. 26, 2004; which claims foreign priority benefit under 35 U.S.C. § 119/365 of European Patent Application No. 03100183.7 filed on Jan. 29, 2003, both of which are incorporated herein by reference.

The invention relates to a data processing circuit with a driver and a receiver that are connected by four signal conductors, over which successive signals are communicated so that the sum of currents through the signal conductors are substantially constant as a function of time.

Conventionally, single signal conductors combined with ground lines are used to communicate digital signals. As an alternative, differential signaling has been used, using a symmetrical pair of signal conductors, driven so that a data value is represented a difference between the currents through the signal conductors. In this case the sum of the currents can be kept constant, which improves noise performance of the circuit. To support communication of multiple bits in parallel, a plurality of such symmetrical pairs of signal conductors can be used.

U.S. Pat. No. 6,359,931 describes a more advanced apparatus that uses N>2 signal conductors for communicating symbols and uses current differences between all $N(N-1)/2$ possible combinations of two signal conductors to encode signals. In the receiver a signal conductor is not just connected to a single comparator, together with another signal conductor with which it forms a pair, rather, each signal conductor is connected to the input of $N-1$ comparators, in combination with each of the $N-1$ remaining signal conductors respectively. Mutually different signal currents are supplied to a respective one of the N conductors. Different symbols are encoded by controlling which of a predetermined set of currents is supplied to which conductor. The comparators in the receiver detect which of the conductors in each of the $N(N-1)/2$ combinations of two conductors carries the most current and the symbol is decoded from the detection results. With this technique a higher transmission capacity (N faculty) can be realized with a given number of N conductors than when a similar number of N conductors is used for transmitting N/2 differential signals (2 to the power N).

In such a system the symmetry of the arrangement of the conductors assumes special importance for avoiding that signal distortion causes signal errors. When the exchange of signals between conductors leads to different couplings and signal delays detection is compromised. Better symmetry will lead to lower Electromagnetic Interference to the environment (EMI). In the case in where the conductors are organized as N/2 pairs only the mutual symmetry between the conductors in a pair is relevant in this respect, to the extent that an interchange of the signals applied to the conductors of the pair does not lead to different signal propagation. But when all $N(N-1)$ possible pairs are used for detection, it is desirable that the properties of interaction between the conductors do not change when the signals on any two conductors are interchanged. This requires a much higher amount of symmetry than for N/2 pairs.

U.S. Pat. No. 6,359,931 describes various arrangements of conductors to realize optimal symmetry. Arrangements are given for three and four conductors. However, the four conductor arrangements merely have symmetry for the interchange of the signals on certain pairs, not for all pairs.

Among other things, it is an object of the invention to provide a circuit of the type mentioned in the preamble that has a higher symmetry of the signal transmission properties under exchange of signals from the conductors.

The circuit according to the invention is set forth in Claim 1. According to the invention four signal conductors are placed in a spatial arrangement in which two signal conductors are arranged in a stack between two shield planes and two other signal conductors are arranged on mutually opposite sides of the stack, each midway between the shield planes. The width of each particular signal conductor is set so that the particular conductor has substantially the same transmission impedance in the transmission line formed by that particular conductor and the shield planes. In general, the transmission impedance of a conductor between shield planes depends on the width of the conductor and the distance to the shield planes. Thus, conductors at different distances from the shield planes have the same transmission impedance provided that their width is progressively decreased as they are closer to one of the shield planes. As a result, paradoxically, the invention uses conductors of different widths to create a higher symmetry for interchange of signals on the signal conductors.

Preferably, the signal conductors are substantially rectangular in shape, the width being set in a direction parallel to the shield planes. Arrangements of rectangular signal conductors are easier to manufacture.

In an embodiment a shield conductor is included in the stack midway between the shield planes. Thus, direct mutual field coupling between the signal conductors is reduced, with the result that the mutual couplings between different pairs of signal conductors are more closely together (near zero).

In another embodiment, the distances between the stack and signal conductors on opposite sides of the stack are set so that mutual coupling between the conductors is substantially equal. By moving the signal conductors on opposite sides of the stack closer to the stack, coupling between these signal conductors is increased. Thus the distance to the stack can be used to control symmetry of coupling. Preferably, the mutual distance of the signal conductors in the stack is adapted as well, so that their mutual coupling equals that between the signal conductors on opposite sides of the stack.

These and other objects and advantageous aspects of the circuit according to the invention will be described in more detail using the following Figures.

Figure 1:
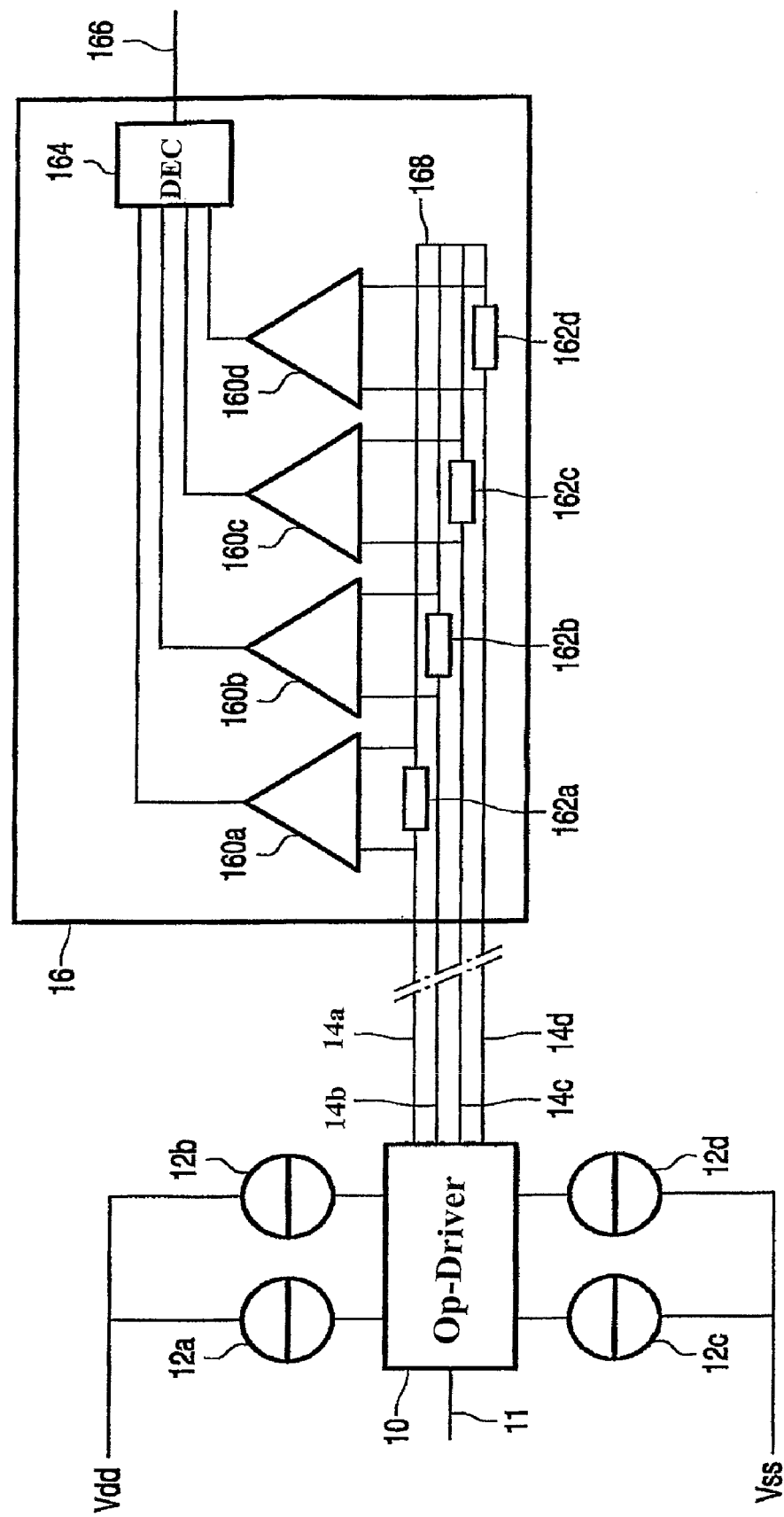
FIG. 1 shows a circuit with a data communication connection.

FIG. 1 shows a circuit with a data communication connection. The circuit contains a driver 10 and a receiver 16 coupled via four signal conductors 14a-d. Driver 10 is supplied from four current sources 12a-d and has a signal input 11. Receiver 16 contains impedances 162a-d in the signal conductors 14a-d and four sense circuits 160a-d for sensing currents via signal conductors 14a-d, through voltage drops over impedances 162a-d. A decoder 164 is coupled to the outputs of the sense circuits. An output of the decoder is an output of receiver 16. Input 11 of driver 10 and output 166 of receiver 16 may be coupled to functional further circuits (not shown) which produce and use the signals transmitted via signal conductors 14a-d respectively.

In operation driver 10 supplies current from current sources 12a-d to signal conductors 14a-d. Driver 10 basically performs the function of a switch matrix, which determines which combinations of current sources 12a-d are connected to which signal conductors 14*a-d*, under the control of input signals supplied to input 11. Thus, for example, when the currents supplied by current sources 12*a-d* are all equal to I, current combinations like (I,I,-I,-I), (2I,0,I,-I) etc and permutations thereof may be supplied to the signal conductors (the currents between a pair of brackets indicating currents to respective ones of the signal conductors 14*a-d* in a specific combination).

Receiver 16 senses the currents through the various signal conductors and signals the sensed currents to decoder 164, which reconstructs the input signals and supplies reconstructed signals to output 166.

In the circuit shown the net sum of currents through signal conductors is zero at all times. As a result, no common impedance to ground need be connected to the common point 168 of the signal conductors (a high impedance bleeder resistance may be included to cope with inaccuracies). The important point, however, is that the net sum of the currents is constant. This makes it possible to communicate data symbols over signal conductors 14*a-d* at a high rate. If the sum is non-zero an impedance may be connected to the common point.

Signal conductors 14*a-d* can be relatively long. To ensure that no significant signal distortion occurs it is desirable that there are little or no reflections over signal conductors 14*a-d* and that there is little or no cross-coupling, or at least that the cross-coupling is symmetrical in the sense that interchanging the currents of any two signal conductors does not significantly affect transmission properties.

Figure 2:
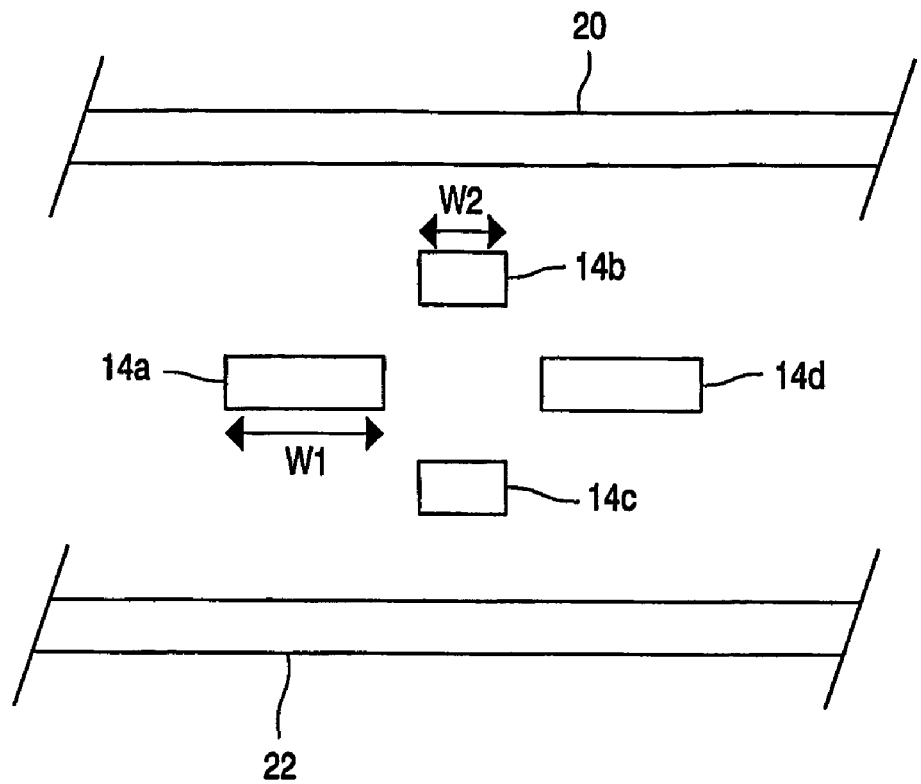
FIG. 2 shows a cross-section of an arrangement of conductors.

FIG. 2 shows a cross section of signal conductors 14*a-d* in a plane perpendicular to the direction of propagation from driver 10 to receiver 16. Signal conductors 14*a-d* are included between conducting shield planes 20, 22 which extend in parallel to each other and to signal conductors 14*a-d* along most or all of the distance from driver 10 to receiver 16 in the direction perpendicular to the plane of cross-section that is shown in FIG. 2. Shield planes 20, 22 are electrically connected to each other, at least for signals in the frequency range used on signal conductors 14*a-d*. This may be realized for example by connecting both shield planes 20, 22 to ground or to a power supply connection Vdd or Vss. The region of the space between shield planes 20, 22 that contains signal conductors 14*a-d* contains a non-conducting medium surrounding signal conductors 14*a-d*. The medium may be a conventional material used for printed circuit boards. The medium is preferably homogeneous between planes 20, 22 or stratified in layers parallel to the planes 20, 22.

Two of the signal conductors 14*b,c* are stacked symmetrically in a perpendicular column between the planes 20, 22. The two other signal conductors 14*a,d* are provided midway between the planes, symmetrically on mutually opposite sides of the stack of signal conductors 14*b,c*. The width W2 of signal conductors 14*b,c* in the stack is smaller than the width W1 of conductors 14*a,d* on mutually opposite sides of the stack. These widths have been chosen so that transmission line impedances of all of the signal conductors 14*a-d* are all substantially equal. These widths have also been chosen so that transmission line impedances of each combination of pairs of two selected conductors from 14*a-d* are substantially equal.

Each of the signal conductors 14*a-d* forms a transmission line in combination with shield planes 20, 22. The transmission impedances of the transmission line formed by a signal conductor 14*a-d* depend on the distance between the signal conductors 14*a-d* and the shield planes 20, 22 and the width W1, W2 of the signal conductor 14*a-d*. For a given distance, the transmission impedance decreases as the width W1, W2 increases and for a given width W1, W2 the impedance decreases when the distance to the closest shield plane 20, 22 decreases. As a result, the same transmission impedance can be realized with a signal conductor 14*b,c* close to the shield planes as with a wider signals conductor 14*a,d* at a greater distance from shield planes 20, 22. This is used in the arrangement of FIG. 2 by choosing widths W1 and W2 so that each signal conductor 14*a-d* has the same transmission line impedance relative to shield planes 20, 22.

The required width W1 or W2 can be determined experimentally for example by measuring the impedances individually and increasing or decreasing the widths of one pair of signal conductors 14*a-d* until matching of the impedances is realized. The impedance of a signal conductor 14*a-d* is a continuously decreasing function of its width: consequently it is always clear in which direction any width should be changed to reduce the difference in impedance. Alternatively, the impedance may be computed using a known computer program for solving Maxwell's equations. In general, the impedances will also depend on the relative location of the various signal conductors 14*a-d*, the distance between planes 20, 22 and the material used for the medium surrounding the signal conductors. This makes it desirable to determine the required widths for each different design of the arrangement of signal conductors 14*a-f* separately.

Preferably, the distance between the signal conductors 14*a-d* is chosen to provide equal coupling strength between each pair of signal conductors 14*a-d*. In principle, there are three different relevant coupling strengths: a first coupling strength between the signal conductors 14*b,c* in the stack, a second coupling strength between the signal conductors 14*a,d* on opposite sides of the stack and a third coupling strength between a signal conductor 14*a* at the side of the stack and a signal conductor 14*b* in the stack. There are also three parameters of the structure that can be set: the distance between the signal conductors 14*b,c* in the stack, the distance between the signal conductors 14*a,d* on opposite sides of the stack and the widths W1, W2 which may be varied as long as the transmission line impedances of all signal conductors 14*a-d* vary in the same way. As a result, these distances and widths can be set so that all coupling strengths become substantially equal. As a further parameter to adjust the coupling strengths relative to one another, the distance between planes 20, 22 may be varied.

Signal conductors 14*a-d* are not shown to scale. However, as shown, signal conductors 14*a-d* are preferably rectangular in shape, all having the same height.

The required distances and impedances can be determined experimentally, by measuring impedances and cross coupling strength and adjusting the distances can be found by gradually increasing or decreasing the distances until the cross-coupling strengths and the impedances are found to be equal. In general, each cross-coupling strength increases continuously as the distance between the relevant signal conductors 14*a-d* is reduced. Consequently, the direction of changes in distance that are required to reduce the difference can readily be determined. In general, the cross coupling strengths will also depend on the relative location of the various signal conductors 14*a-d*, the distance between planes 20, 22 and the material used for the medium surrounding the signal conductors. This makes it desirable to determine the required distances and widths for each different design of the arrangement of signal conductors 14*a-f* separately.

Figure 3:
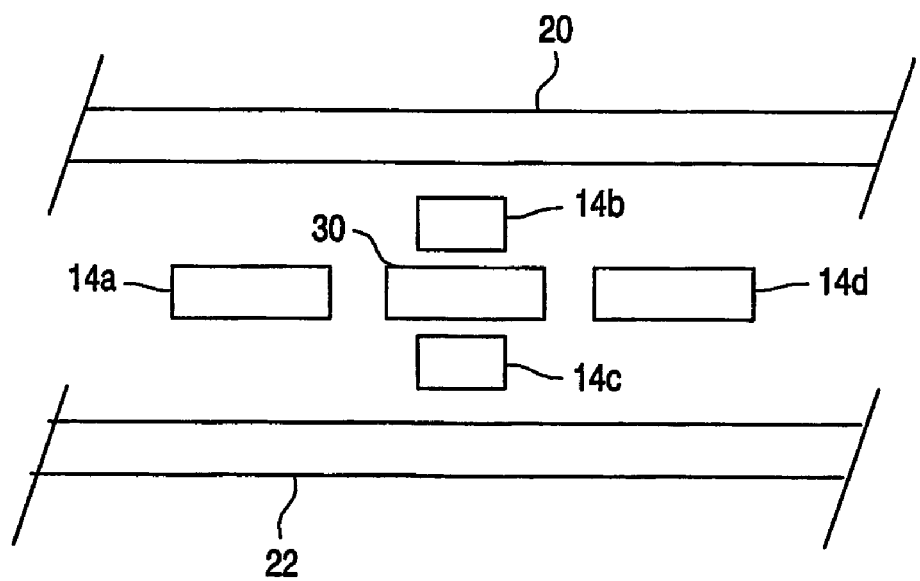
FIG. 3 shows a further cross-section of an arrangement of conductors.

FIG. 3 shows a cross section of an arrangement of signal conductors 14*a-d*. In comparison with FIG. 2 a shield conductor 30 has been added, which is located in the stack of signal conductors 14*b,c*, midway between planes 20, 22. Shield conductor 30 is electrically connected to shield planes, at least for signals in the frequency range of the signals on signal conductors 14a-d. Shield conductor 30 serves to reduce the coupling strength between signal conductors 14a-d. Preferably, shield conductor 30 is wider than the signal conductors 14c,d in the stack. The widths of signal conductors 14a-d are chosen so that substantially equal transmission impedances of the transmission lines formed by, on the one hand, shield planes 20, 22 and shield conductor 30 and, on the other hand, respective ones of the signal conductors 14a-d are realized.

In addition to the conductors shown in FIGS. 2 and 3 additional conductors may be added, for example shield conductors midway between planes 20, 22 on opposite sides of the arrangement of the four signal conductors 14a-d. Additional sets of four signal conductors may be added in parallel for transmitting more signals in parallel.

The signal conductors 14a-d may be applied for example on printed circuit boards, or the substrate of a multi component module (MCM) to couple a driver 10 in one integrated circuit chip to a receiver in another integrated circuit chip, or in the packages of BGA ICs for proper signal transfer from the die to the PCB.

The invention claimed is:

1. A data processing circuit, comprising:
   a driver with four signal outputs;
   a receiver with four inputs;
   a first, second, third and fourth signal conductors, each connected between a respective one of the inputs and outputs;
   first and second mutually coupled conducting shield planes, the first and second signal conductors forming a symmetrical stack in a column between the first and the second plane, the third and fourth signal conductors being arranged substantially midway between the first and the second plane, on mutually opposite sides of the stack, the first, second, third and fourth signal conductors having respective widths so that respective transmission line impedances of transmission lines between each particular one of the first, second, third and fourth signal conductors and the first and second planes are substantially mutually equal.

2. A data processing circuit according to claim 1, further comprising a shield conductor located between the first and the second signal conductor midway between the first and the second plane.

3. A data processing circuit according to claim 2, wherein the shield conductor extends further in a direction parallel to the first and the second plane and perpendicular to a direction of propagation than the first and the second one of the conductors.

4. A data processing circuit according to claim 1, wherein a first distance between the first and second signal conductors in the stack, a second distance between the third and fourth signal conductors and the widths of the first, second, third and fourth signal conductors have been selected so that there is substantial equality between a first coupling strength between the first and second signal conductors, a second coupling strength between the third and fourth signal conductors and a third coupling strength between the third or fourth signal conductors and the first or second signal conductor.

5. A data processing circuit according to claim 1, further comprising four current sources, and wherein the driver is configured to supply current from the four current sources to the first, second, third and fourth signal conductors.

6. A data processing circuit according to claim 5, wherein the driver is configured to supply current from the four current sources to the first, second, third and fourth signal conductors such that the net sum of currents through the first, second, third and fourth signal conductor is zero.

7. A data processing circuit according to claim 1, wherein the receiver includes four sense circuits that are each configured to sense a current through one of the first, second, third and fourth signal conductors, a decoder coupled to outputs of each of the four sense circuits, and four impedances, each of which is coupled between inputs of a respective one of the four sense circuits.

8. A data processing circuit according to claim 1, wherein the widths of the first and second signal conductors are equal, the widths of the third and fourth signal conductors are equal, and the widths of the third and fourth signal conductors are greater than the widths of the first and second signal conductors.

9. A data processing circuit according to claim 1, further comprising a non-conducting medium that is located between the first and second conducting shield planes and that surrounds each of the first, second, third and fourth signal conductors.

10. A transmission medium for providing a signal from a driver to a receiver, the transmission medium comprising:
    first and second conducting shield planes that are electrically connected to each other;
    first, second, third and fourth signal conductors that are each located between the first and second conducting shield planes, the first, second, third and fourth signal conductors having respective widths, in a plane that is perpendicular to a direction of propagation of the signal in the signal conductors, such that transmission line impedances of each of the first, second, third and fourth signal conductors are substantially equal, wherein, in the plane, the first and second signal conductors form a symmetrical perpendicular stack between the first and second conducting shield planes and, in the plane, the third and fourth signal conductors are located substantially midway between the first and second conducting shield planes and on opposite sides of the stack from each other; and
    a non-conducting medium that is located between the first and second conducting shield planes and that surrounds each of the first, second, third and fourth signal conductors.

11. A transmission medium according to claim 10, further comprising a shield conductor that is located in the stack between the first and the second signal conductors midway between the first and second conducting shield plane.

12. A transmission medium according to claim 11, wherein the shield conductor has a width that is greater than the widths of the first and second signal conductors.

13. A transmission medium according to claim 10, wherein the widths of the first and second signal conductors are equal, the widths of the third and fourth signal conductors are equal, and the widths of the third and fourth signal conductors are greater than the widths of the first and second signal conductors.

* * * * *